(12) United States Patent
Kashyap et al.

(10) Patent No.: US 10,165,699 B2
(45) Date of Patent: Dec. 25, 2018

(54) OXIDIED AND COATED ARTICLES AND METHODS OF MAKING SAME

(71) Applicant: HEWLETT-PACKARD DEVELOPMENT COMPANY, L.P., Houston, TX (US)

(72) Inventors: Chalam Kashyap, Fort Collins, CO (US); Kuan-Ting Wu, Taipei (TW)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/518,522

(22) PCT Filed: Jan. 28, 2015

(86) PCT No.: PCT/US2015/013174
§ 371 (c)(1),
(2) Date: Apr. 12, 2017

(87) PCT Pub. No.: WO2016/122467
PCT Pub. Date: Aug. 4, 2016

(65) Prior Publication Data
US 2017/0325347 A1    Nov. 9, 2017

(51) Int. Cl.
*B32B 3/02* (2006.01)
*H05K 5/04* (2006.01)
(Continued)

(52) U.S. Cl.
CPC .............. *H05K 5/04* (2013.01); *C23C 28/00* (2013.01); *C23C 28/345* (2013.01);
(Continued)

(58) Field of Classification Search
CPC ........ H05K 5/04; C23C 28/00; C23C 28/345; C25D 11/026; C25D 11/04; C25D 11/18;
(Continued)

(56) References Cited

U.S. PATENT DOCUMENTS

| 6,846,574 B2 | 1/2005 | Subramanian |
| 2009/0041988 A1 | 2/2009 | Ho |

(Continued)

FOREIGN PATENT DOCUMENTS

| CN | 101377000 | 3/2009 |
| CN | 203172098 | 9/2013 |

(Continued)

OTHER PUBLICATIONS

Zhang, R.F. et al; "Formation process of micro arc oxidation coatings obtained in a sodium phytate containing solution with and without CaCO3 on binary Mg-1.0Ca alloy"; Nov. 1, 2014: 3 pages.

*Primary Examiner* — Elizabeth E Mulvaney
(74) *Attorney, Agent, or Firm* — HPI Patent Department (57) ABSTRACT

One example provides a method of manufacturing. The method comprises oxidizing, using plasma, a first surface of a substrate comprising a metal-material. The method further comprises cutting into the substrate through the oxidized first surface to expose a non-oxidized second surface of the substrate, the second surface not parallel to the first surface. The method further comprises disposing, using electrophoretic deposition, a coating layer over the exposed second surface to form an article having the oxidized first surface and the coated second surface.

15 Claims, 4 Drawing Sheets

(51) Int. Cl.
- *C23C 28/00* (2006.01)
- *C25D 13/12* (2006.01)
- *C25D 11/02* (2006.01)
- *C25D 11/04* (2006.01)
- *C25D 11/18* (2006.01)
- *C25D 11/26* (2006.01)
- *C25D 11/30* (2006.01)
- *C25D 11/34* (2006.01)
- *C25D 13/20* (2006.01)

(52) U.S. Cl.
CPC ............ *C25D 11/026* (2013.01); *C25D 11/04* (2013.01); *C25D 11/18* (2013.01); *C25D 11/26* (2013.01); *C25D 11/30* (2013.01); *C25D 11/34* (2013.01); *C25D 13/12* (2013.01); *C25D 13/20* (2013.01)

(58) Field of Classification Search
CPC ......... C25D 11/26; C25D 11/30; C25D 11/34; C25D 13/12; C25D 13/20
See application file for complete search history.

(56) References Cited

U.S. PATENT DOCUMENTS

| | | |
|---|---|---|
| 2010/0112297 A1 | 5/2010 | Dai et al. |
| 2012/0251839 A1 | 10/2012 | Zhang et al. |
| 2014/0272405 A1 | 9/2014 | Okerberg et al. |

FOREIGN PATENT DOCUMENTS

| | | |
|---|---|---|
| CN | 103668190 | 3/2014 |
| CN | 103668391 | 3/2014 |
| EP | 2690203 A1 | 1/2014 |
| KR | 10-2009-0061406 A | 6/2009 |

Fig. 1

Making a portion of a housing of an electronic device having an electrical circuit, wherein the making comprises:

oxidizing, using micro-arc oxidation, a first surface of a substrate comprising a metal-material;

cutting, using diamond cutting, into the substrate through the oxidized first surface to expose a non-oxidized second surface of the substrate, the second surface not parallel to the first surface; and     disposing, using electrophoretic deposition, a coating layer over the exposed second surface to form the portion having the oxidized first surface and the coated second surface

S201

Assembling the electrical circuit with the housing, the housing external to the electrical circuit

OXIDIED AND COATED ARTICLES AND METHODS OF MAKING SAME

BACKGROUND

The housing/casing of an electronic device may comprise multiple Components. The components may include covers in the case of a portable electronic device having a display, these covers may include a top cover ("A cover"), the display itself ("B cover"), the keyboard cover ("C cover"), and the bottom cover ("D cover"). Depending an the application, the cover may comprise a variety of suitable materials.

BRIEF DESCRIPTION OF THE DRAWINGS

The drawings are provided to illustrate various examples of the subject matter described herein in this disclosure (hereafter "herein" for short, unless explicitly stated otherwise) related to a housing structure and are not intended to limit the scope of the subject matter. The drawings are not necessarily to scale.

DETAILED DESCRIPTION

The housing of electronic devices, particularly those of portable electronic devices, is frequently subject to mechanical deformation due at least in part to its frequent contact with other objects (e.g., table, hand, ground, etc.). These devices, particularly the housing thereof, often need to have materials having high mechanical strength and high hardness, so as to withstand wear. At the same time, the housing structure often has certain cosmetic features that make the structure at least visually appealing to a consumer user.

In view of the foregoing, the Inventors have recognized and appreciated the advantages of a housing structure, particularly one in the housing of an electronic device, as manufactured by the methods described herein. Following below are more detailed descriptions of various examples related to a housing structure, particularly the methods of making same. The various examples described herein may be implemented in any of numerous ways.

Provided in one aspect of the examples is a method of manufacturing, comprising: oxidizing, using plasma, a first surface of a substrate comprising a metal-material; cutting into the substrate through the oxidized first surface to expose a non-oxidized second surface of the substrate, the second surface not parallel to the first surface; and disposing, using electrophoretic deposition, a coating layer over the exposed second surface to form an article having the oxidized first surface and the coated second surface.

Provided in another aspect of the examples is a method of manufacturing, comprising: making a portion of a housing of an electronic device having an electrical circuit, wherein the making comprises: oxidizing, using micro-arc oxidation, a first surface of a substrate comprising a metal-material; cutting, using diamond cutting, into the substrate through the oxidized first surface to expose a non-oxidized second surface of the substrate, the second surface not parallel to the first surface; and disposing, using electrophoretic deposition, a coating layer over the exposed second surface to form the portion having the oxidized first surface and the coated second surface; and assembling the electrical circuit with the housing, the housing external to the electrical circuit.

Provided in another aspect of the examples is an electronic device, comprising: an electrical circuit; and a housing external to the electrical circuit, a portion of the housing comprising a substrate having: a core layer comprising a metal material; an oxide layer disposed over a first surface of the core layer, the oxide is a micro-arc oxide of the metal material; and a functional coating disposed over the oxide layer, the functional coating comprising a polymer; an edge of the substrate having a non-oxidized second surface not parallel to the first surface, the second surface cut by diamond cutting and having thereon an electrophoretically deposited coating layer comprising at least one of polyacrylic, epoxy, and nanoparticles.

Micro-Arc Oxidation ("MAO")

Micro-Arc Oxidation ("MAO") is also known as plasma electrolytic oxidation. MAO is an electrochemical process of oxidation that may generate an oxide coating layer on a conductive material, such as a metal material. A "metal material" herein may refer to a pure metal, a metal alloy, an intermetallic, or a metal-containing composite. The metal material may comprise aluminium, magnesium, titanium, etc. In contrast to an anodizing process, an MAO employs a high potential such that the discharges may occur and the resulting plasma may modify the structure of the oxide layer.

The MAO may involve creating micro-discharges on a surface of the metal material immersed in an electrolyte. The MAO process may be employed to form relatively thick and mostly crystalline oxide coating. The thickness of costing may be, for example, tens or hundreds of micrometers, but is not limited to any particular value. For example, depending on the application and the processes carried out, a MAO coating of a larger or smaller thickness may be produced. The resultant micro-arc oxide coating may be dense and/or ductile and may have a relatively high hardness, particularly in contrast to an oxide layer formed by anodization.

In contrast to a deposition process, MAO is a chemical conversion process. Specifically, the oxide layer formed as a result of MAO is a result of oxidation of the underlying metal-material substrate, instead of an oxide layer being deposited onto the substrate. As a result, in comparison to a deposition-based process (e.g., spray coating), an MAO coating may have a higher adhesion to the underlying metal-material substrate.

Diamond Cutting

The term "diamond cutting" herein may refer to the technique of cutting a materiel using a diamond blade. The diamond blade may be a saw blade that has diamonds fixed on its edge for cutting a material, such as a hard and/or abrasive material. Any suitable type of diamond blade may be used, depending on the material to be cut.

Diamond cutting may be employed in a variety of applications. In one example, diamond cutting is employed to cut semiconductor material. In another example, diamond cutting is employed to cut a metal material, such as cutting through a protective layer (e.g., oxide layer) thereon and/or into the metal material itself to expose a portion of the underlying metal material. The exposed electrically conductive metal material of the substrate may allow processes such as electrophoretic deposition to proceed on the conductive metal material.

Electrophoretic Deposition

The term "electrophoretic deposition" ("ED") herein may encompass a number of known industrial processes, including electrocoating, e-coating, cathodic electrodeposition, anodic electrodeposition, and electrophoretic coating, and electrophoretic painting. An ED method may involve any suitable number of processes and any suitable number of materials. For example, ED may Involve disposing colloidal particles suspended in a liquid medium using an electric field over an electrically conducive surface. The electrically conductive surface may be that of an electrode. In one example, the migration of particles using the influence of an electric field is known as electrophoresis.

ED may involve aqueous processes or non-aqueous processes. The processes and me processing parameters may vary, depending on the materials involved. ED may be versatile with respect to the type of material being disposed over a substrate. In general, any colloidal particles that may be employed to form stable suspensions and that may carry an electrical charge may be employed in ED. In one example, the substrate over which the material is disposed using ED is electrically conductive. For example, the material suitable for ED may include polymers, pigments, dyes, ceramics, metals, etc. The type of suitable material may also depend on whether it is a cathodic or an anodic material for the ED. In one example, the material to be disposed over a substrate comprises at least one of polyacrylic, epoxy, and nanoparticles. In one example, the material to be disposed by ED comprises one of polyacrylic and epoxy. In another example, nanoparticles are added to the polymer to be disposed by ED to control the surface profile, color performance, or both. The nanoparticles may comprise a metal, a compound (e.g., a metal oxide, such as silica). In another example, the material to be disposed by ED comprises a dye.

Method of Manufacturing

Figure 1:
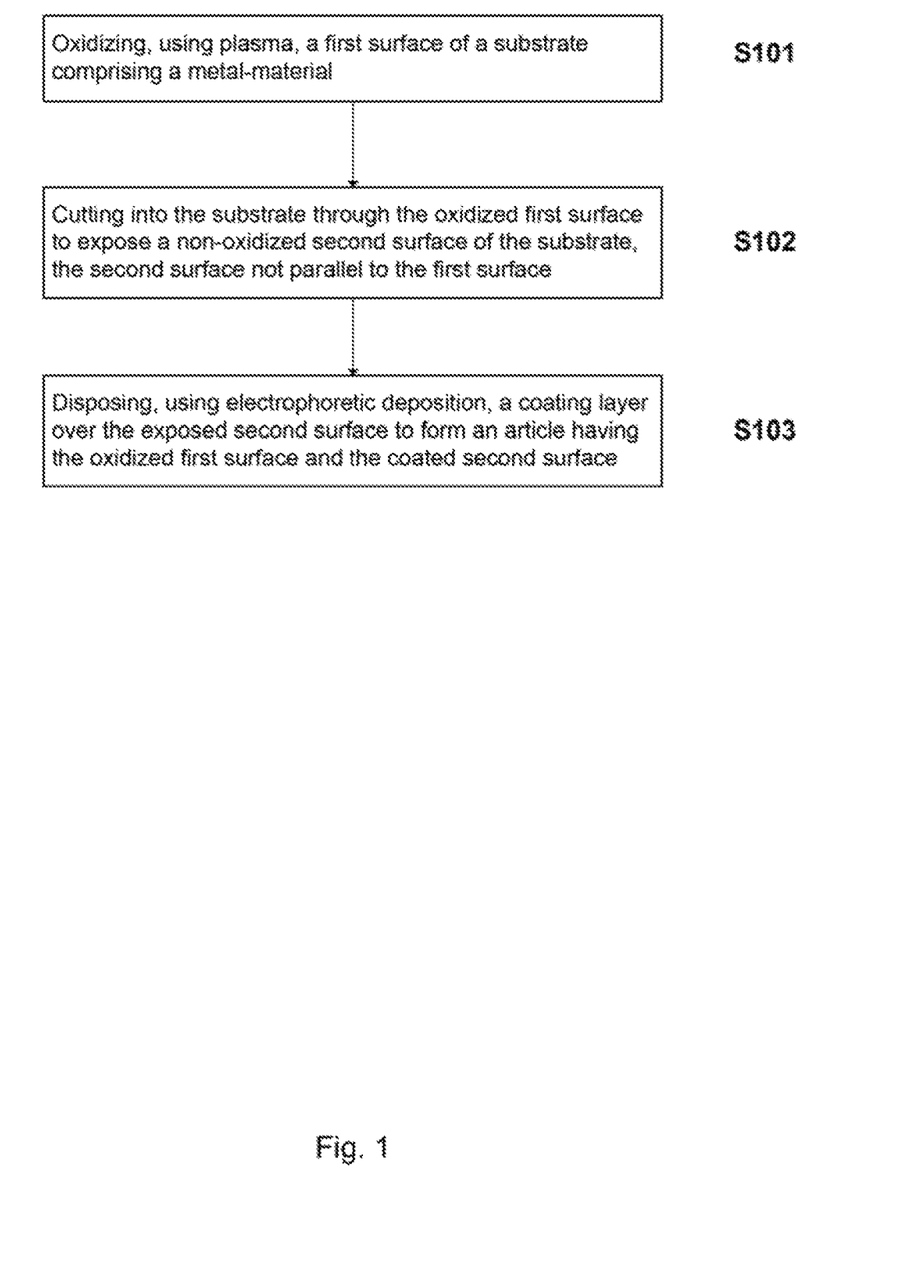
FIG. 1 provides a flowchart showing the processes involved in one example of a method of manufacturing described herein.

The housing structure, or a portion thereof, described herein may be manufactured by a method involving any suitable number of processes. FIG. 1 shows the processes involved in one example of such a method. The manufacturing method as shown in FIG. 1 may comprise oxidizing, using plasma, a first surface of a substrate comprising a metal-material (S101). The oxidation process may involve any suitable processes), such as MAO as described above. Depending on the materials and the technique involved, any suitable oxidation parameters may be employed. It is noted that the terms "first," "second," "third," etc. herein are merely employed to show the respective objects described by these terms as separate entities and are not meant to connote a sense of chronological order, unless stated explicitly herein.

The manufacturing method may further comprise cutting into the substrate through the oxidized first surface to expose a non-oxidized second surface of the substrates, the second surface not parallel to the first surface (S102). The cutting process may involve any suitable process, such as diamond cutting as descried above. The second surface may be related to the first surface at any angle. For example, the second surface may be perpendicular to the first surface. For example, the second surface may be at any angle between 1° and 90° relative to the second surface. Subsequently, the manufacturing method may further comprise disposing, using electrophoretic deposition, a coating layer over the exposed second surface to form en article having the oxidized first surface end the coated second surface (S103). The technique of electrophoretic deposition may be as described above. For example, the material to be disposed may be those described above.

Figure 2:
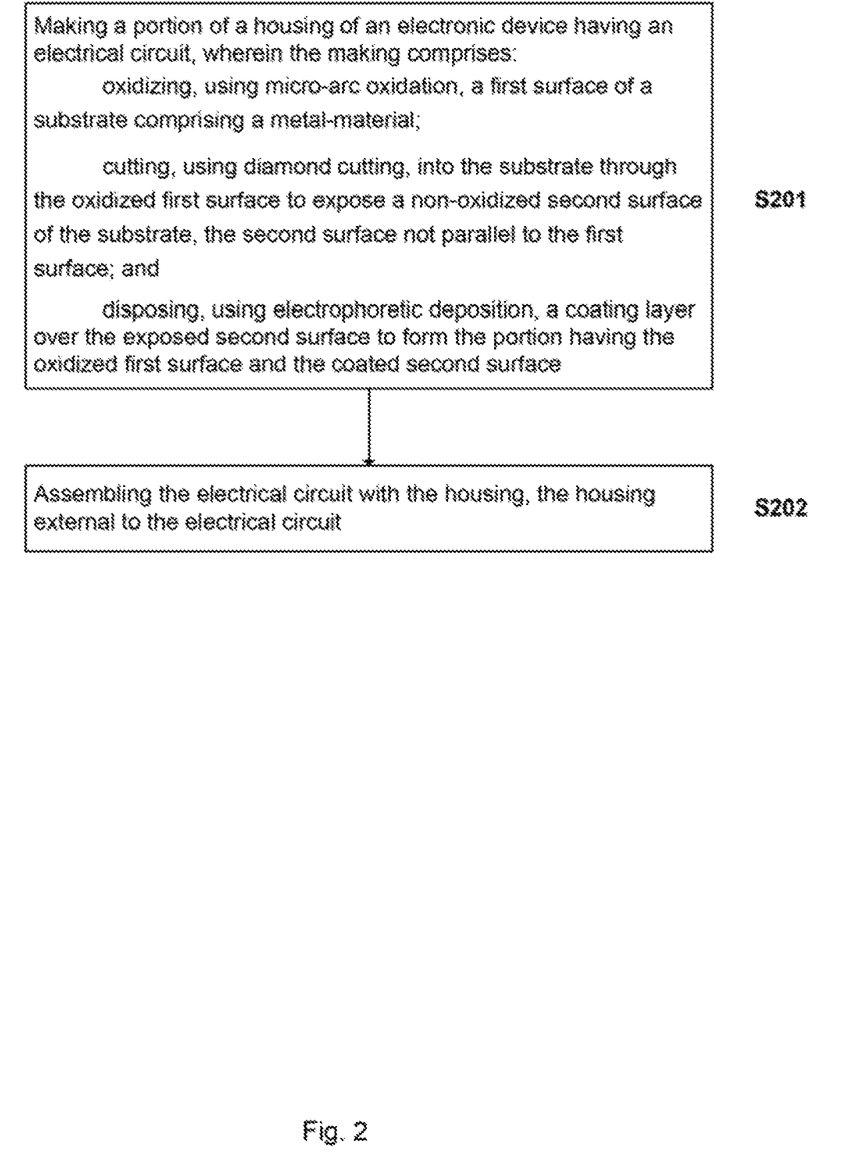
FIG. 2 provides a flowchart showing the processes involved in another example of a method of manufacturing described herein.

The housing structure described herein, such as that manufactured by the method as shown in FIG. 1 may be employed in various applications, as described further below. Depending on the application, the methods of manufacturing as described in FIG. 1 may be modified. FIG. 2 shows the processes involved in another example of a method of manufacturing an electronic device. As shown in FIG. 2, this method may comprise making a portion of a housing of an electronic device having an electrical circuit (S201). More than one electrical circuit is possible. An "electronic device" is described further below. This process of making the portion of the housing may comprise oxidizing, using micro-arc oxidation, a first surface of a substrate comprising a metal-material. The process of making may further comprise cutting, using diamond cutting, into the substrate through the oxidized first surface to expose a non-oxidized second surface of the substrate, the second surface not parallel to the first surface. The process of making may further comprise disposing, using electrophoretic deposition, a coating layer over the exposed second surface to form the portion having the oxidized first surface and the coated second surface.

Subsequently, the method of fabrication may further comprise assembling the electrical circuit with the housing, the housing external to the electrical circuit (S202).

Figure 3:
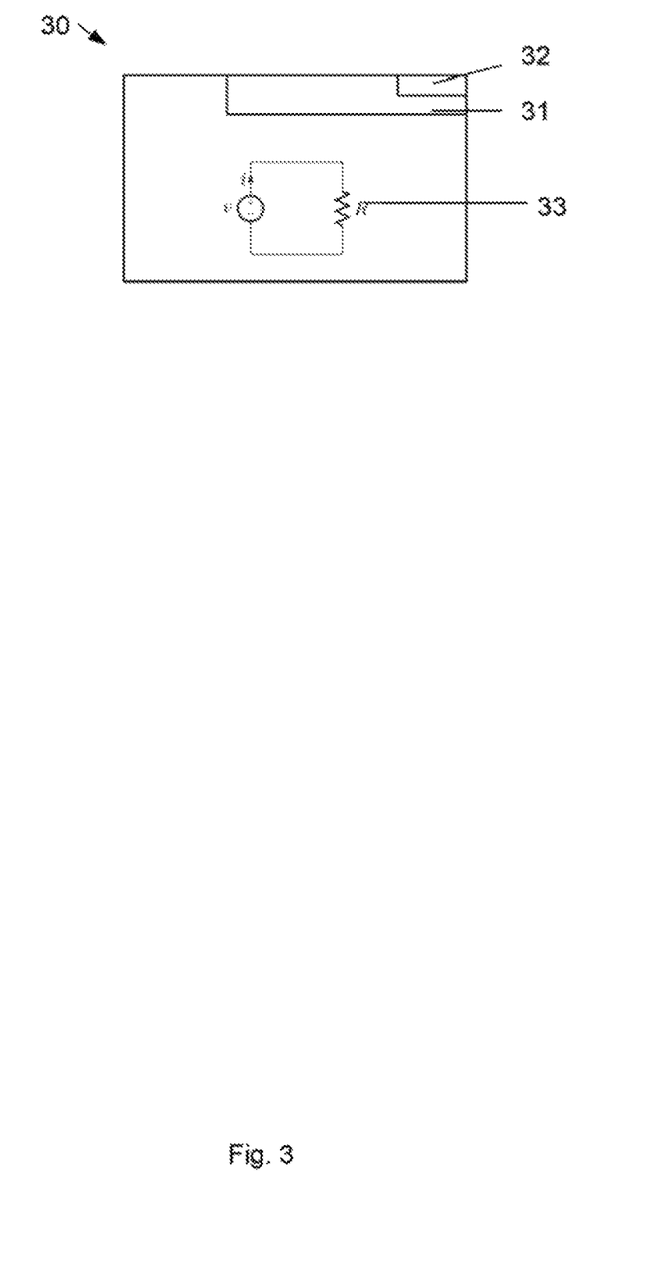
FIG. 3 shows, in one example, a schematic of an electronic device comprising a housing structure described herein.

FIG. 3 shows, in one example, a schematic of an electronic device 30 comprising a housing 31 (only a portion thereof is shown in the figure) described herein. The housing may comprise a portion 32 that has the substrate described herein. The housing (or a part thereof) 31 is external to the electrical circuit 33 in the interior of the device 30. The electrical circuit 33 may be any type of electrical circuit having any suitable configuration and component. It is noted that while FIG. 3 shows that the structure is in a portion of the top cover, the structure may constitute the entire cover on one side, or multiple sides, as a part of the housing of the device.

Figure 4A:
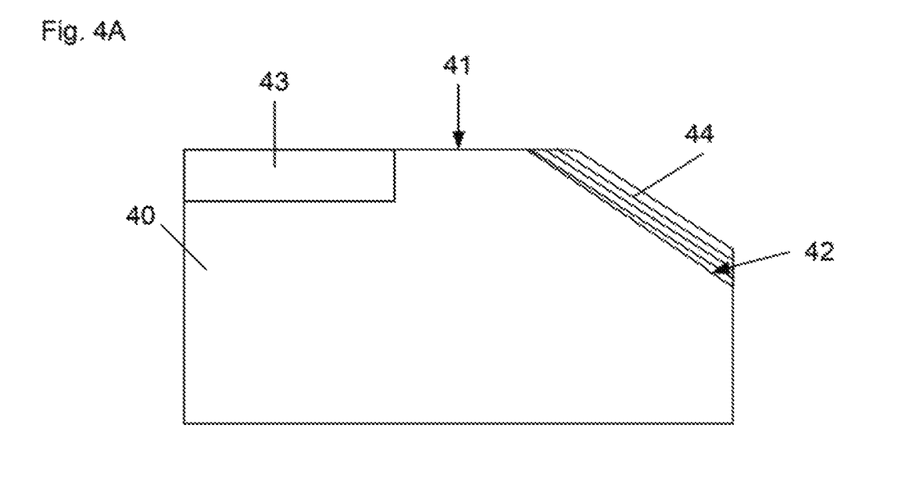
FIGS. 4A-4B show, in one example, schematic diagrams of the housing Structure as described herein: 4A shows a schematic diagram of the structure with different surfaces and layers, and 4B shows a schematic diagram of the components of a portion of the housing structure.
Figure 4B:
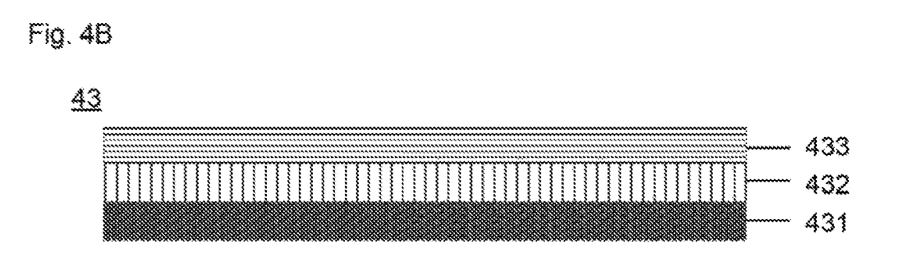

FIGS. 4A-4B provide schematic diagrams to further illustrate one example of the housing structure described herein. As a result of the manufacturing method as described herein, such as those shown in FIG. 1 and FIG. 2, the substrate 40 has an first surface 41 to be oxidized and a second surface 42 to be ED coated. It is noted that while the first surface 41 and the second surface 42 in this figure are shown not to be perpendicular to each other, they may be, if desired. The oxidized structure 43 in FIG. 4A is further shown in FIG. 4B. It is noted that the structure 43 is shown as only a portion of the surface 41 of the substrate 40 in FIG. 4A only to facilitate the illustration. The structure 43 may encompass a portion or the entire surface 41 of the substrate 40. The second surface 42 is coated with an ED coating layer 44 as described above.

The oxidized structure of the substrate 43 is further described in FIG. 4B. As shown in the figure, the structure includes a substrate of the metal-material 431. The layer 431 may comprise one single layer of the metal Material. Alternatively, the layer 431 may comprise multiple sub-layers (not shown), at least one of which comprises the metal material. An oxide layer 432, such as one formed by MAO, is disposed over the metal-material substrate 431. As further noted below, in some examples, the oxide layer 432 is further coated with a functional coating 433, although the functional coating need not be present. In one example, the structure as shown in FIGS. 4A and 4B may be a portion of the housing structure of an electronic device.

Depending on the application, any suitable material may be employed in the methods of manufacturing described herein. The metal material (of the substrate) may comprise a pure metal, a metal alloy, an intermetallic, a metallic compound, or a metal-containing composite. Note that the substrate may comprise one single layer of the metal material or may comprise multiple layers of the same of different materials, at least some of which is the metal material. The metal material may comprise at least one of aluminium, magnesium, lithium, zinc, titanium, niobium, iron, and copper. In one example, an iron-containing metal material is steel, such as stainless steel. In one example, the metal material comprises magnesium or an alloy thereof. The metal material may comprise an alloy of any of the aforementioned metal elements or a combination of any of the aforementioned metal elements.

The equipment that may be employed for the manufacturing methods described herein is not limited. As long as the equipment may perform the processes as described herein, the equipment may be used.

Depending on the application, the methods of manufacturing described herein may involve various processes as a part of, or other than, those described above. In one example, before the oxidation process, the substrate is formed by any suitable method, such as one involving at least one of computer numerical control machining and forging. The parameters of the processes may vary depending on the materials and processes involved, in another example, before the oxidation process, the surface to be oxidized (i.e., the first surface) is pre-treated. Examples of surface pre-treatment may involve at least one of decreasing and surface activation. The de-greasing may involve application of pressure, solvent, temperature, etc, depending on the materials involved, to remove oil from the surface. Surface activation may involve exposing the first surface to a bath before the oxidation. The bath may be acidic or alkaline.

The methods of manufacturing described herein may further comprise disposing a functional coating layer over the oxidized (first) surface. The functional coating may be disposed before or after the cutting process in one example, the functional coating is disposed over the oxidized surface before the cutting process. The functional coating may be disposed by any suitable technique. For example, the functional coating may be disposed using spray coating or dipping the surface over which the functional coating is to be formed into a bath to coat the surface with the functional coating material.

The functional coating may be any suitable type of coating, depending on the application desired. For example, the functional coating may be one of: protective coating, anti-finger print coating, soft touch coating, anti-bacterial coating, anti-smudge coating, and insulation coating, in one example, the functional coating may provide soft touch feeling, particularly when the coating comprises polyurethane.

Depending on the application, the functional coating may comprise any suitable material. For example, the functional coating may comprise a hydrophobic material. For example, the functional coating may comprise at least one polymer. The polymer may be one of, for example, polystyrene, polyimide, polyarelene ether, polyurethane, methylsilsequioxane, polyethylene, polystyrene silicone, butyl rubber, polyamide, polycarbonate, styrene-butadiene rubber, polyacrylate, epoxy, and fluoropolymer. Other types of polymers are also possible. In one example wherein the polymer is a polyimide, the polymer is fluorinated polyimide, polyvinyl chloride polyimide, or Kapton® (available from E.I. du Pont de Nemours and Company, USA), in one example wherein the polymer is a polyamide, the polymer is nylon. In one example wherein the polymer is a polystyrene, the polymer is acrylonitrile butadiene styrene ("ABS"). In one example, the functional coating comprises polyurethane.

In addition to aforementioned polymers, the functional coating may also comprise other types of materials, including an anti-bacterial agent a filler, etc. A filler may be any suitable material depending on the application. The filter nay be an organic material or an inorganic material. For example, the filler may be a ceramic. Examples of a suitable filter may include carbon black, titanium dioxide, clay, mica, talc, barium sulfate, calcium carbonate, synthetic pigment, metallic powder, aluminum oxide, an organic powder, an inorganic powder, graphene, graphite, and dispersed elastomers.

The methods of manufacturing described herein may further comprise disposing a powder coating layer over the oxidized surface after the cutting process. The powder coating layer may also be disposed over the diamond-cut surface in some instances. The powder coating may serve to protect the MAO oxide surface. The powder coating may be disposed by any suitable techniques. For example, the powder coating may be disposed using electrostatic spray deposition. Other techniques are also possible. The powder coating may comprise any suitable material or materials, depending on the application. Examples of a suitable material for the powder coating include epoxy, poly(vinyl chloride), polyamide, polyester, polyurethane, polyacrylic, etc. Additives, such as binders, may also be added, depending on the application. The aforementioned materials may be employed in the coating in any combination.

The methods of manufacturing described herein may further comprise preparation processes for any of the processes described herein. For example, the substrate, after being subjected to the oxidation and cutting processes may be treated before being subjected to the ED process. The treatment may involve any number of suitable processes, depending on the materials involved. For example, the surface that is cut, such as by diamond cutting, herein referred to as the second surface, may be de-greased before the ED process. The de-greased second surface may be further rinsed. Any rinsing agent, such as water, may be employed. The rinsed second surface may be further polished, such as by chemical polishing. Depending on the materials involved, any suitable chemical polishing agent may be employed. For example, the polishing agent may be an acid or a base. The chemically polished second surface may be further rinsed again. The rinsing may be carried by the same type of rinsing agent in the previous rinsing process or different type. The rinsed second surface may be further de-smutted. Any suitable etching agent may be employed for the de-smutting, depending on the materials involved. The de-smutted second surface may be further cleaned, such as by ultrasonic cleaning.

The methods of manufacturing described herein may further comprise post-deposition process(es), after an ED coating layer is formed on the substrate. Any suitable post-processing processes may be employed. For example, after the ED coating layer is formed, the methods of manufacturing may further comprise rinsing at least the coated surface of the substrate and dehydrating at least the rinsed coated surface. The rinsing may involve any suitable rinsing agent, such as those described above. The dehydration may involve any suitable process, depending on the application. Examples of dehydration may be the application of heat, air or both.

The methods of manufacturing described herein may further comprise inspection of the product after a particular process. An inspection may involve any quality control process. An inspection process may be applied after any of the processes described herein is completed. In one example, an inspection process is employed for the substrate after at least one of the cutting (e.g., diamond cutting) and ED processes.

As a result of the manufacturing methods described herein, the housing structure descried herein may have certain beneficial properties. For example, due at least in part to the MAO process, the structure described herein may have a relatively high hardness, particularly in comparison to a structure made by an anodization process. For example, the housing structure described herein may have a pencil hardness of at least about 5 H—e.g., about 8 H, about 7 H, about 8 H, or about 9 H. Other values are possible, in one example, housing structure described herein may have a pencil hardness of between about 5 H and about 9 H—e.g., between about 6 H and about 8 H, etc. Other values are also possible. The pencil hardness described herein may refer to any portion of the housing structure described herein, including the portion covered by an MAO oxide layer.

Additionally, the different surfaces as a result of the manufacturing methods described herein allow a desirable surface finishing gloss and a metallic luster feeling, due at least in part to the use of electrophoretic deposition to create a coating layer it is noted that ED also provides an opportunity to introduce colors to the coating, rather than the black/gray coating of some other pre-existing coating techniques. These features may be particularly desirable in an electronic device, such as those described further below. Moreover, the coating layer as formed by ED may be further reworked to be beneficial to enhance production yield rate. The use of ED also allows a shorter cycle time to have high productivity. In comparison to some other pre-existing coating methods. Further, the use of MAO process herein may reduce the surface reactivity of certain metal materials, particularly the magnesium alloys, and MAO is more environmentally friendly and may provide a higher throughput, particularly in comparison to an anodization process.

Applications

Due at least in part to the numerous aforedescribed desirable properties, the housing structure described herein may be employed in various applications. For example, the housing structure may be an integral part of a structural component. The component may be a part of the housing of an electronic device. A housing of a device may refer to any structural component that encloses the interior of the device. In one example, the housing structure described herein is a part of the housing of an electronic device. For example, me housing structure may be any part of the housing, including back cover, front cover, side cover, and the like, of the device.

An electronic device herein may refer to any device comprising at least one electrical circuit. Thus, in one example, the housing that comprises the housing structure described herein may be external to the electrical circuit. The electronic device may be a consume electronic device. An electronic device may refer to portable/mobile electronic device. An electronic device herein may refer to a computer, a memory storage, a display, a signal transmitting device, and the like. A computer may refer to a desktop, a laptop, a tablet, a phablet a tablone, and the like. A storage unit may refer to the hardware of a hard drive, a server, a processor, and the like. A display may refer to a monitor, a liquid crystal display ("LCD"), a television, and the like. A signal transmitting device may refer to a device transmitting any type of signal, including light, sound, heat, and the like. In one example, the electronic device is a mobile phone.

Additional Notes

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The indefinite articles "a" and "an," as used herein in this disclosure, including the claims, unless clearly indicated to the contrary, should be understood to mean "at least one." Any ranges cited herein are inclusive.

The terms "substantially" and "about" used throughout this disclosure, including the claims, are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%: such as less than or equal to ±0.05%.

Concentrations, amounts, and other numerical data may be expressed or presented herein in a range format. Such a range format is used merely for convenience and brevity and thus should be interpreted flexibly to include not only the numerical values explicitly recited as the limits of the range, but also to include all the individual numerical values or sub-ranges encompassed within that range as if cacti numerical value and sub-range is explicitly recited. As an illustration, a numerical range of "1 weight % (wt %) to 5 wt %" should be interpreted to include not only the explicitly recited values of 1 to 5 wt %, but also include individual values and sub-ranges within the indicated range. Thus, included in this numerical range are individual values, such as 2, 3, 5, and 4, and sub-ranges, such as from 1-3, from 2-4, and from 3-5, etc. This same principle applies to ranges reciting only one numerical value. Furthermore, such an interpretation should apply regardless of the breadth of the range or the characteristics being described.

The phrase "and/or," as used herein in this disclosures including the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one example, to A only (optionally including elements other than B); in another example, to B only (optionally inducing elements other than A); in yet another example, to both A and B (optionally including other elements); etc.

As used in this disclosure, including the claims, "or" should be understood to have the same meaning as "and/or"

as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used the claims, shall have its ordinary meaning as used in the held of patent law.

As used in this disclosure, including the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements.

In this disclosure, including the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, § 2111.03.

What is claimed:

1. A method of manufacturing, comprising:
   oxidizing, using plasma, a first surface of a substrate comprising a metal-material;
   cutting into the substrate through the oxidized first surface to expose a non-oxidized second surface of the substrate, the second surface not parallel to the first surface;
   disposing a functional coating or a powder coating layer over the oxidized first surface; and
   disposing, using electrophoretic deposition, a coating layer over the exposed second surface to form an article having the oxidized first surface and the coated second surface.

2. The method of claim 1, wherein the method comprises at least one of the following:
   the oxidizing involving micro-arc oxidation; and
   the cutting involving diamond cutting.

3. The method of claim 1, before the oxidizing, further comprising forming the substrate by at least one of computer numerical control machining and forging.

4. The method of claim 1, before the oxidizing, further comprising pre-treating the first surface using at least one of degreasing and surface activation.

5. The method of claim 1, after the cutting, further comprising disposing, using electrostatic spray deposition, the powder coating layer over the oxidized first surface.

6. The method of claim 1, further comprising disposing the functional coating over the oxidized first surface, the functional coating comprising at least one polymer selected from the group consisting of polystyrene, polyimide, polyarelene ether, polyurethane, methylsilsesquioxane, polyethylene, polystyrene silicone, butyl rubber, polyamide, polycarbonate, styrene-butadiene rubber, polyacrylate, epoxy, and fluoropolymer.

7. The method of claim 1, before the disposing, further comprising:
   de-greasing at least the second surface of the substrate;
   rinsing at least the de-greased second surface;
   chemically polishing at least the rinsed second surface;
   rinsing at least the chemically polished second surface;
   de-smutting at least the rinsed second surface; and
   ultrasonically cleaning at least the de-smutted second surface.

8. The method of claim 1, further comprising:
   rinsing at least the coated second surface of the substrate; and
   dehydrating at least the rinsed coated second surface.

9. The method of claim 1, wherein the coating layer comprises at least one of polyacrylic, epoxy, and nanoparticles.

10. The method of claim 1, wherein the metal material comprises at least one of aluminium, magnesium, lithium, zinc, titanium, niobium, iron, copper, an alloy of any of the foregoing, and a combination of any of the foregoing.

11. A method of manufacturing, comprising:
    making a portion of a housing of an electronic device having an electrical circuit, wherein the making comprises:
       oxidizing, using micro-arc oxidation, a first surface of a substrate comprising a metal-material;
       cutting, using diamond cutting, into the substrate through the oxidized first surface to expose a non-oxidized second surface of the substrate, the second surface not parallel to the first surface; and
       disposing, using electrophoretic deposition, a coating layer over the exposed second surface to form the portion having the oxidized first surface and the coated second surface;
       disposing a functional coating or a powder coating layer over the oxidized first surface; and
    assembling the electrical circuit with the housing, the housing external to the electrical circuit.

12. The method of claim 11, wherein the functional coating comprises polyurethane.

13. The method of claim 11, wherein the powder coating layer includes a powder comprising at least one of epoxy, poly(vinyl chloride), polyamide, polyester, polyurethane, and polyacrylic.

14. An electronic device, comprising:
    an electrical circuit; and
    a housing external to the electrical circuit, a portion of the housing comprising a substrate having:
       a core layer comprising a metal material;
       an oxide layer disposed over a first surface of the core layer, the oxide is a micro-arc oxide of the metal material; and
       a functional coating disposed over the oxide layer, the functional coating comprising a polymer;
       an edge of the substrate having a non-oxidized second surface not parallel to the first surface, the second surface cut by diamond cutting and having thereon an electrophoretically deposited coating layer comprising at least one of polyacrylic, epoxy, and nanoparticles.

15. The electronic device of claim 14, wherein the substrate has a pencil hardness of between about 6 H and about 9 H.

* * * * *

UNITED STATES PATENT AND TRADEMARK OFFICE
CERTIFICATE OF CORRECTION

PATENT NO. : 10,165,699 B2  
APPLICATION NO. : 15/518522  
DATED : December 25, 2018  
INVENTOR(S) : Chalam Kashyap et al.

Page 1 of 1

It is certified that error appears in the above-identified patent and that said Letters Patent is hereby corrected as shown below:

In the Claims

In Column 9, Lines 62-63, Claim 6, delete "polyarelene" and insert -- polyarylene --, therefor.

Signed and Sealed this  
Fifth Day of March, 2019

Andrei Iancu  
*Director of the United States Patent and Trademark Office*